United States Patent [19]
Madsen et al.

[11] Patent Number: 6,109,934
[45] Date of Patent: Aug. 29, 2000

[54] CONNECTOR FOR CONNECTING AN ELECTRONIC DEVICE TO A COMMUNICATIONS CARD

[75] Inventors: Brent D. Madsen, Providence; David D. Oliphant, West Valley City, both of Utah

[73] Assignee: 3COM Corporation, Santa Clara, Calif.

[21] Appl. No.: 09/201,647

[22] Filed: Nov. 30, 1998

[51] Int. Cl.[7] .................................................. H01R 9/09
[52] U.S. Cl. ............................................................. 439/79
[58] Field of Search ............................ 439/79, 395, 396, 439/638–654, 928.1

[56] References Cited

U.S. PATENT DOCUMENTS

| | | | |
|---|---|---|---|
| 4,186,988 | 2/1980 | Kobler | 339/176 |
| 4,778,410 | 10/1988 | Tanaka | 439/676 |
| 5,035,641 | 7/1991 | Van-Santbrink et al. | 439/329 |
| 5,044,981 | 9/1991 | Suffi et al. | 439/533 |
| 5,051,099 | 9/1991 | Pickles et al. | 439/108 |
| 5,118,311 | 6/1992 | Margini | 439/676 |
| 5,139,439 | 8/1992 | Shie | 439/359 |
| 5,155,663 | 10/1992 | Harase . | |
| 5,183,404 | 2/1993 | Aldous et al. | 439/55 |
| 5,244,412 | 9/1993 | Hatch et al. | 439/567 |
| 5,310,360 | 5/1994 | Peterson | 439/571 |
| 5,336,099 | 8/1994 | Aldous et al. | 439/131 |
| 5,338,210 | 8/1994 | Beckham | 439/131 |
| 5,364,294 | 11/1994 | Hatch et al. | 439/676 |
| 5,391,094 | 2/1995 | Kakinoki et al. . | |
| 5,411,405 | 5/1995 | McDaniels | 439/131 |
| 5,463,261 | 10/1995 | Skarda et al. | 307/131 |
| 5,478,252 | 12/1995 | Lecomte et al. | 439/180 |
| 5,478,261 | 12/1995 | Bogese, II | 439/676 |
| 5,499,923 | 3/1996 | Archibald | 439/26 |
| 5,503,572 | 4/1996 | White et al. | 439/676 |
| 5,505,633 | 4/1996 | Broadbent | 439/329 |
| 5,538,442 | 7/1996 | Okada | 439/676 |
| 5,547,401 | 8/1996 | Aldous et al. . | |
| 5,561,727 | 10/1996 | Akita et al. | 385/88 |
| 5,562,504 | 10/1996 | Moshayedi | 439/638 |
| 5,608,607 | 3/1997 | Dittmer | 361/686 |
| 5,634,802 | 6/1997 | Kerklaan | 439/131 |
| 5,637,018 | 6/1997 | Gargiulo | 439/640 |
| 5,660,568 | 8/1997 | Moshayedi | 439/654 |
| 5,679,013 | 10/1997 | Matsunaga et al. | 439/144 |
| 5,727,972 | 3/1998 | Aldous et al. | 439/655 |
| 5,773,332 | 6/1998 | Glad | 439/344 |
| 5,775,951 | 7/1998 | Gargiulo | 439/640 |

FOREIGN PATENT DOCUMENTS

| | | |
|---|---|---|
| 61-256850 | 11/1986 | Japan . |
| WO95/13633 | 5/1995 | WIPO . |

Primary Examiner—Brian Sircus
Assistant Examiner—J. F. Duverne
Attorney, Agent, or Firm—Workman, Nydegger & Seeley

[57] ABSTRACT

The present invention relates to a system for interconnect modularity of an electronic communication card such as a PCMCIA card where a printed circuit board has a peninsular electrical lead configuration upon a finger section thereof and an electronic device that is slidably disposed upon the peninsular lead configuration. The electronic device preferably has a standardized footprint and the device may be an electrical interconnect such as a cable, a jack such as an RJ-11 jack, an IRDA transceiver, a combination cable and 4-pin connector, and an electronic video interface. The system provides a solution to insufficient spacing between tip and ring leads and remaining leads on a 15-pin connector required by various international safety standards. The system may also include a translucent portion of the electronic device and a light source that, in combination provide a visual diagnostic output for the user.

29 Claims, 7 Drawing Sheets

CONNECTOR FOR CONNECTING AN ELECTRONIC DEVICE TO A COMMUNICATIONS CARD

BACKGROUND OF THE INVENTION

1. The Field of the Invention

The present invention relates to a multiple-use port in an electronic device and to devices that are insertable in the multiple-use port. The present invention also relates to a replacement device for a removable RJ-11 jack and a multi-use port into which the jack is plugged. The replacement device may be any one of a variety of devices including an RJ-45 removable jack, an interface cable connection, an infrared receive and transmit device, a video interface, a compact flash memory card, and the like. The multi-use port is standardizable to receive any and all of the above-mentioned devices.

2. The Relevant Technology

The advent of the Personal Computer Modem Card International Association card (PCMCIA card) has allowed for the development of various connectors thereto. Some connectors access the PCMCIA card by plugging directly thereinto by a lateral attachment. Others plug thereinto by connecting with an extendable jack, such as an XJACK® manufactured by 3Com, corporation of santa clara, california that is released by a push and that receives a plug either vertically, horizontally, or at an angle thereto.

One problem that has arisen is that various international safety standards require a minimum gap between the tip and ring pins and the remaining pins. For example, in a 15-pin connector, the gap must be between 1.4 mm and 2.5 mm. The typical Honda-style 15-pin connector does not allow for this large of a gap to chassis ground or to the secondary circuits that may be connected in pins 4 through 15. As such, a typical PCMCIA card has limitations where such safety standards are required.

Another problem in the prior art is that connections to PCMCIA cards often have custom-shaped cables and interconnections that use a variety of connectors. These connection schemes are often unique and have a singular interface method or require "podules" or other bulky adapters. Some manufacturers have had custom interfaces molded directly into the end of the PCMCIA card. These custom interfaces also require the use of custom cables, Another problem that existed was that most use of off-the-shelf connectors causes them to be susceptible to damage due to the mounting at the face of the connector and due to shallow penetration on the interface. A most common type of failure of the typical cables are the connectors due to their fragility.

Another common problem is that several connectors to PCMCIA cards can be easily disengaged because a locking mechanism is not provided.

What is needed in the art is a multimedia interconnection port that overcomes the problems of the prior art. It would therefore be an advancement in the art to provide a system for interconnect modularity with an electronic communication card that standardizes the electronic link for a variety of devices such as interconnects, transceivers, and video units.

It would be an advancement in the art to provide a system for interconnect modularity with a PCMCIA card that provides a locking mechanism therefore and that standardizes the electronic link for a variety of devices such as interconnect, transceivers, and video units.

Such connector ports, electronic devices, and systems are disclosed and claimed herein.

SUMMARY AND OBJECTS OF THE INVENTION

The present invention relates to a multimedia and interconnection port that may house such devices as an RJ-11 removable jack, an interface cable connection, an infrared receive and transmit port, a video interface, a compact flash memory card, and other devices that may be connectable to an electronic communication card.

In general, the present invention relates to a system for interconnect modularity on an electronic communication card. Preferably, the electronic communication card is a PCMCIA card. The system includes a printed circuit board (PCB) that has a PCB finger and a peninsular electrical lead configuration upon the PCB finger. At least one electrical lead terminates at the end of the PCB finger. Additionally, the inventive system has an electronic device that is slidably disposed upon the peninsular electrical lead configuration. Thereby, the electronic device makes electrical contact with the peninsular electrical lead configuration. An example thereof is a tip and ring terminus on the PCB and corresponding electrical runners from the electronic device that slidably make contact with the peninsular tip and ring leads.

Examples of interconnects include an RJ-11 jack, and an RJ-45 jack. These interconnects have runners that make electrical contact to the peninsular electrical lead configuration and are slidably in contact therewith. Another example of the electronic device is "a device for transmitting data via light waves. Preferably this data is transferred according to standards developed by the Infrared Data Association (IRDA) and the electronic device may use components such as an IRDA port, IRDA receiver and/or IRDA transceiver to transmit and receive the data." The IRDA transceiver has runners that make electrical contact with leads from the peninsular electrical lead configuration and is slidably disposed thereupon. Another example of an electronic device is an electronic video interface. As with the other electronic devices, electrical runner contacts are slidably disposed upon the peninsular electrical lead configuration.

The peninsular electrical lead configuration may have up to eight electrical leads or more upon its upper surface. Additionally, it may have up to eight electrical leads or more upon its lower surface. In general, therefore, the PCB may have at least two electrical leads, at least one of which is upon the upper surface of the PCB and at least one of which is upon the lower surface of the PCB. The PCB is preferably flat, wherein the upper and lower surfaces are substantially parallel planar.

The peninsular electrical lead configuration is preferably laid out upon a finger of a PCB that is suspended above the floor and ceiling within the housing of the electronic communication card.

Another embodiment of the present invention includes any of the above configurations of structures and combinations, and the electronic device that makes contact with the peninsular electrical lead configuration has a housing, a shell, or a portion thereof which may be translucent. The translucent housing, shell, or portion of the electronic device is configured to receive light energy from a light source that is mounted upon the PCB. A preferred light source may include a light emitting diode (LED). It may also include an incandescent light.

The inventive system is particularly useful for interconnect modularity of an electronic communication card such as a PCMCIA card with various preferred devices. Plan-view footprint standardization according to the present invention provides that any electronic device that makes contact with the peninsular electrical lead configuration has substantially the same plan-view footprint regardless of the type of electronic device that is disposed thereupon. Generally speaking, this standard plan-view footprint is understood to be that portion of any electronic device that is insertable along the peninsular electrical lead configuration of the electronic communication card. In particular, a preferred plan-view footprint comprises a first rectangle and second rectangle that are intersecting. The first rectangle generally contains the majority of the electronic structure of the electronic device, and the second rectangle, being shorter and narrower than the first rectangle orthogonally intersects the second rectangle and is configured to make a partially enclosed physical connection with a guide rail structure that is part of the electronic communication card. The partially enclosed sliding structure may be configured to have at least one and preferably two locking mechanisms that securely hold the electronic device in the electronic communication card.

Any portion of an electronic device that is not insertable within the geometry of the electronic communication card extends beyond the card and is generally exposed to the user's view. An example of such an electronic device is a cable connector.

It is therefore an object of the present invention to provide a system for interconnect modularity on a PCMCIA card that includes a standardized connection for a variety of electronic devices. It is also an object of the present invention to provide a system for interconnect modularity on a PCMCIA card that provides a large number of electrical leads for interconnection with an electronic device. It is also an object of the present invention to provide a system for interconnect modularity on a PCMCIA card wherein the electronic device is latched into the PCMCIA card.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawing depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to a multimedia and interconnection port that may house such devices as a removable jack, an interface cable connection, an infrared receive and transmit port, a video interface, and other devices that may be connectable to an electronic communications card.

Figure 1:
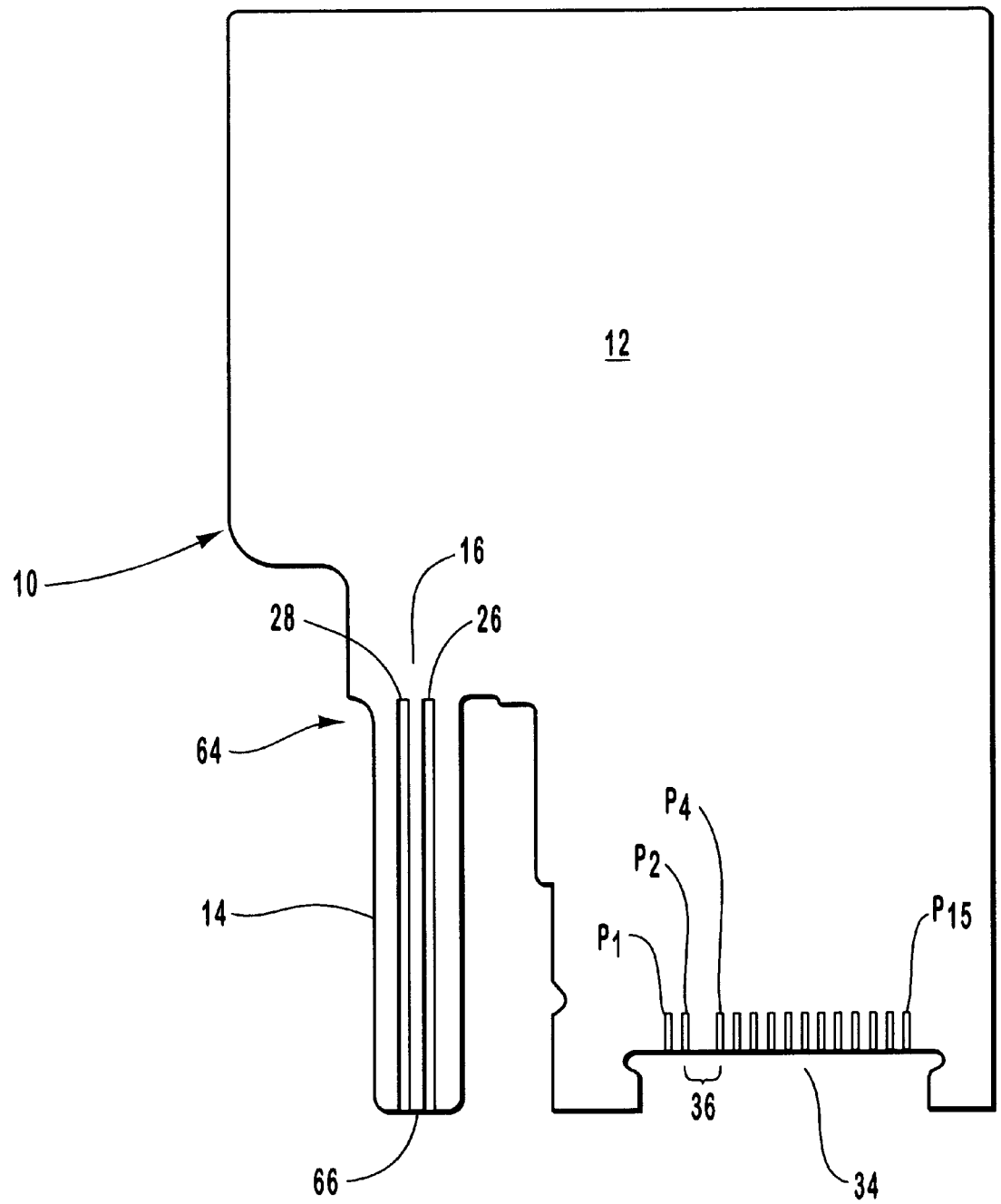
FIG. 1 is plan view illustration of an electronic communications card printed circuit board with a finger thereof that is part of the present invention.

"FIG. 1 illustrates a portion of an electronic communications card 10. The electronic communications card 10 is preferably a PCMCIA card but other suitable types, sizes and configurations of communication cards may also be used.". It can be seen that an electronic communications card, such as the PCMCIA card, comprises a solid-state electronic circuitry support means. One example of a solid-state electronic circuitry support means is a printed circuit board (PCB). Other embodiments of the solid-state electronic circuitry support means are known in the art. FIG. 1 illustrates one embodiment of a solid-state electronic circuitry support means as a printed circuit board 12 with a distinctive feature of a finger 14 of PCB 12 that is separate from the generally rectangular shape of PCB 12. Upon finger 14 of PCB 12, an electrical contact means is disposed upon the solid-state electronic circuitry support means. The electrical contact means has an elongate layout such as a peninsular electrical lead configuration 16. As such. the electrical contact means, in this case, peninsular electrical lead configuration 16, can be seen as beginning at an origin 64 of finger 14 and running lengthwise thereupon to a terminus 66 of finger 14.

Peninsular electrical lead configuration 16 may comprise at least one lead that acts as an electrical trace upon finger 14. As can be seen in FIG. 1, a first lead 26 and a second lead 28 are depicted. As many as eight leads or more may be found on one surface of PCB 12. It is also seen that a 15-pin connector 34 may be part of PCB 12. "For example, the 15-pin connector 34 includes pins $P_1$ through $P_5$ and the connector typically includes a gap 36 between pins $P_2$ and $P_4$ where pin $P_3$ has been removed. Pin $P_3$ is often removed according to standard practice in order to assure sufficient insulation between pin $P_2$ and pin $P_4$. Alternatively, where a gap greater than gap 36 is required, the first lead 26 and the second lead 28 may act as tip and ring leads such that there is a significant distance between the leads and the pins $P_1$ to $P_{15}$ of the 15-pin connector 34." Additionally, where tip and ring leads are part of peninsular electrical lead configuration 16, there is no need to pull pin 3 from 15-pin connector 34. As such, additional communication capability is provided for 15-pin connector 34

An electronic communication means is slidably disposed upon the electrical contact means. In this embodiment, the electronic communication means is disposed upon finger 14 of PCB 12. The electronic communication means typically is an electronic device. As such, various electronic devices may be installed upon PCB 12 at finger 14. Electrical contact is made by runners that make contact with leads such as first lead 26 and second lead 28. The electronic device is slidably disposed upon peninsular electrical lead configuration 16 as will be developed further.

Figure 2:
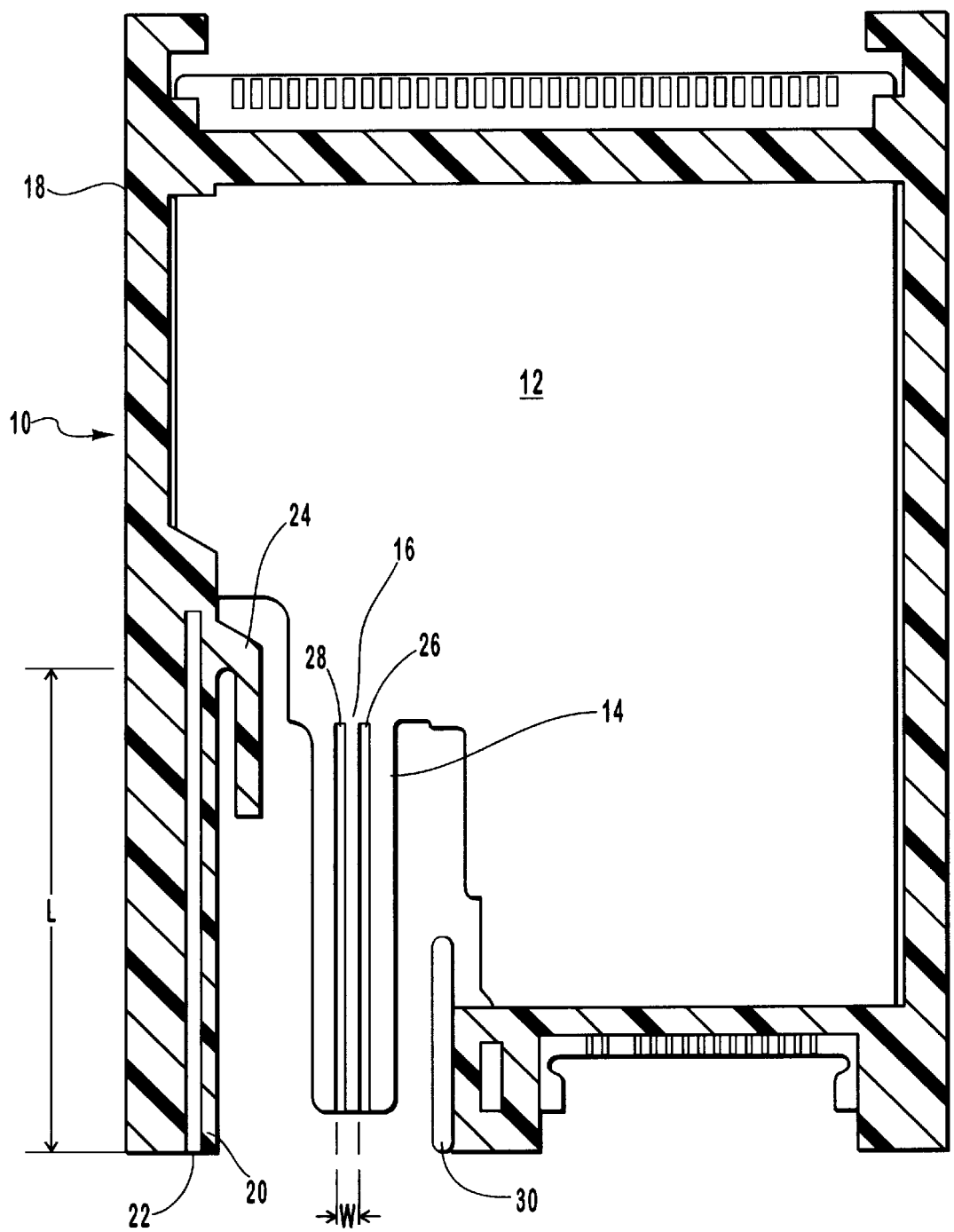
FIG. 2 is a view of the printed circuit board illustrated in FIG. 1 with a frame superimposed thereupon that acts as both a spacing mechanism and an insertable electronic device guiding and locking mechanism.

FIG. 2 illustrates electronic communications card 10 with a frame 18 superimposed thereupon. As such, the combination of electronic communications card 10 and frame 18 may be part of a PCMCIA card. The electronic device that is to be slidably disposed upon peninsular electrical lead configuration 16 is held in place and secured by a gripping means for guiding the slidably disposed electronic communication means. One example of the gripping means for guiding the electronic device is a combination of a rail 20 and an edge 30. Rail 20 is used both to guide the electronic device in its rail slot 22 and to create a locking mechanism to hold the electronic device in place such that it cannot be pulled out with less than 8 to 10 $lb_f$. Typically, interconnects of the prior art may be pulled out of their sockets with only about 2 to 3 $lb_f$.

"A spring (not shown) is preferably placed over the spring guide 24 such that the electronic device is spring-loaded to facilitate optional removal and/or "pop-out" functionality."

Peninsular electrical lead configurations may have up to eight electrical leads or more upon the upper surface of PCB 12. FIG. 2, and well as FIG. 1, illustrates two electrical leads as a first lead 26 and a second lead 28. The aspect ratio of peninsular electrical lead configuration 16 is defined as the length L beginning at or near origin 64 of finger 14 and ending at or near terminus 66 of finger 14 divided by the width W defined as the right edge of the rightmost lead (first lead 26) to the left edge of the leftmost lead (second lead 28). The aspect ratio, depending upon the number of leads and length L may be about 2:1, about 4:1, about 6:1, about 8:1, about 10:1. about 12:1, about 16:1, and about 20:1 or greater.

Figure 3:
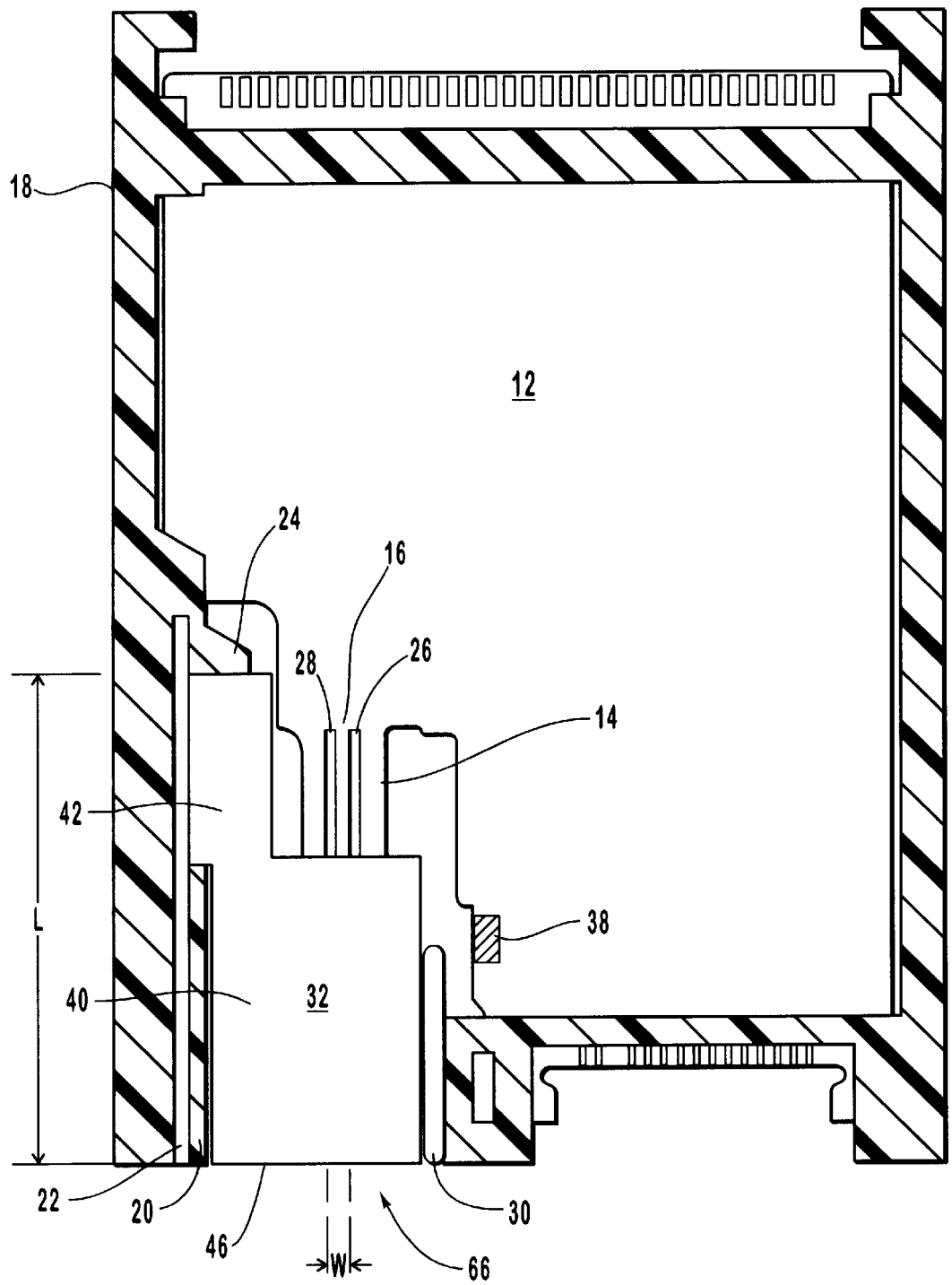
FIG. 3 is a view of the printed circuit board depicted in FIG. 2 with a device footprint that is superimposed over a portion of the finger of the PCB and over part of the frame.

FIG. 3 illustrates electronic communications card 10 with frame 18 superimposed thereupon and a device footprint 32 is illustrated as covering a portion of finger 14 of PCB 12 and being mounted upon rail 20 in rail slot 22 at the left side and upon edge 30 on the right side. It can be seen that device footprint 32 is composed of two generally rectangular shapes, a first rectangle 40 and a second rectangle 42. First rectangle 40 and second rectangle 42 intersect substantially orthogonally upon one corner each thereof. Another embodiment of the present invention includes the provision of a light source 38 mounted upon PCB 12. Light source 38 may be a light emitting diode (LED) and the like. Light source 38 may also be an incandescent light and the like. Light source 38 is configured to shine substantially perpendicularly onto an electronic device that substantially fills device footprint 32. The electronic device that makes contact with peninsular electrical lead configuration 16 and that substantially fills device footprint 32 may have a housing, a shell, or a portion thereof which is translucent. As such, the translucent portion thereof may act as a light pipe to receive light energy from light source 38 and to redirect the light energy through the electronic device in the direction of terminus 66 of finger 14. As such, visible light may be seen emanating from the electronic device that substantially fills device footprint 32. An alternative embodiment includes the translucent structure that fills device footprint 32 without light source 38.

The inventive system is particularly useful for interconnect modularity of electronic communications card 10 such as a PCMCIA card with various preferred devices. Plan-view footprint standardization according to the present invention provides that any electronic device that makes contact with peninsular electrical lead configuration 16 may have substantially the same device footprint 32 regardless of the type of electronic device. Generally speaking, this standardization of device footprint 32 is understood to be that portion of any electronic device that is insertable along peninsular electrical lead configuration 16 of finger 14 of PCB 12.

Generally speaking, first rectangle 40 contains the majority of the electronic structure of the electronic device and second rectangle 42 provides physical connection to the rail 20 and the rail slot 22. That portion of the electronic device that is second rectangle 42 may be configured in connection with rail 20 and rail slot 22 to form a locking means to secure the electronic device in contact with peninsular electrical lead configuration 16. The locking means may have at least one, and preferably two locking mechanisms that securely hold the electronic device in the electronic communications card. The locking means may be a first locking means for holding the slidably disposed electronic communication means in a recessed configuration such that it is substantially flush with the edge of a larger device into which it has been inserted. The locking means may also have a second locking means for holding the slidably disposed electronic communication means in an extended position such as for an extendable jack like the XJACK®. The configuration of at least one, and preferably two locking mechanisms is set forth in U.S. Pat. Nos. 5,336,099 and 5,183,404; the disclosures of which are incorporated herein by specific reference.

Figure 4:
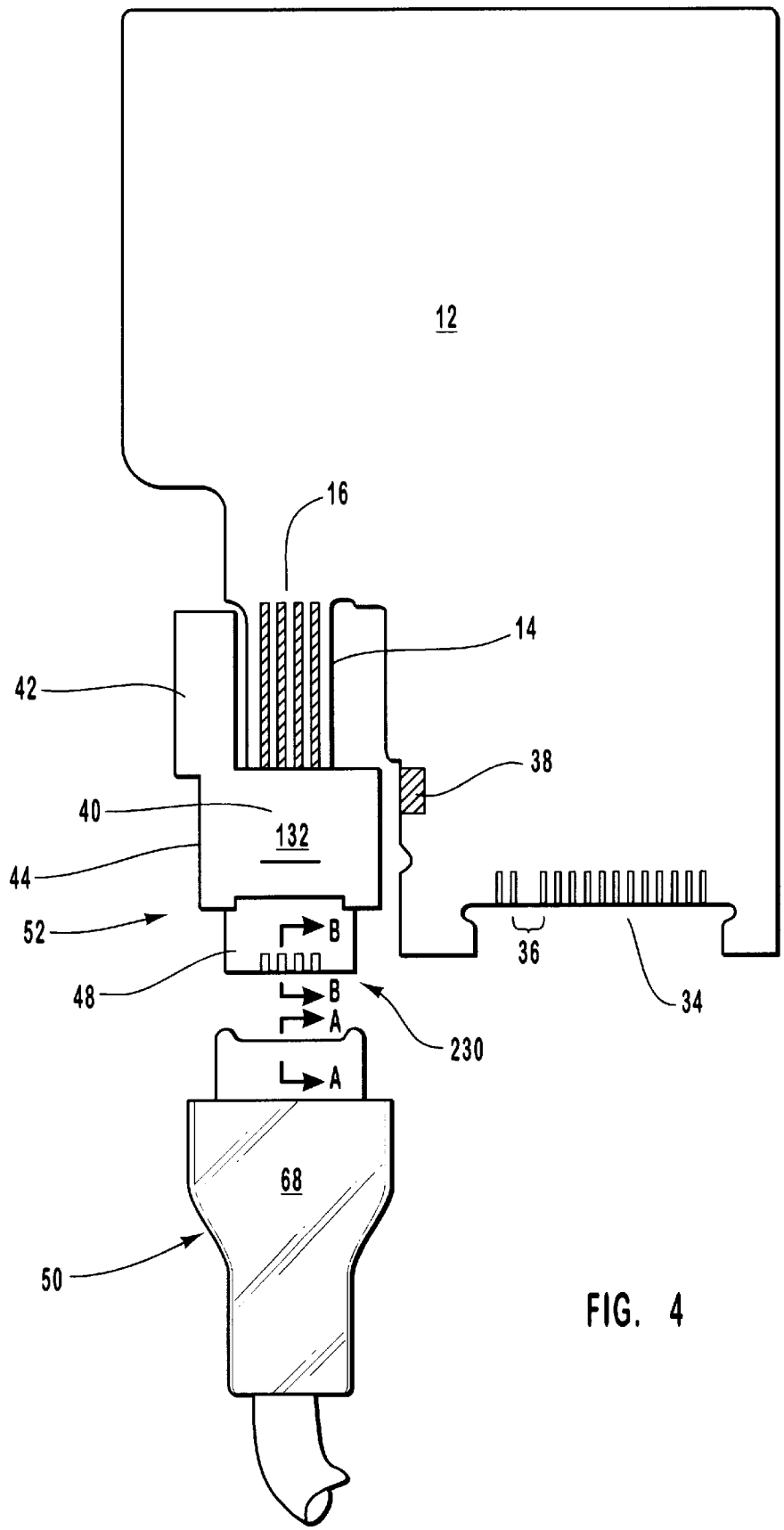
FIG. 4 is an alternative embodiment of the PCB depicted in FIG. 1 wherein an interconnect electronic device and a cable are illustrated as being modularly connectable therewith.

Any portion of the electronic communication means that is not insertable within the geometry of device footprint 32 will extend beyond the terminus 66 of finger 14 of PCB 12. As such, that portion that extends therebeyond is generally exposed to the user's view. FIG. 4 illustrates another embodiment of the present invention wherein it can be seen that a device footprint 132 comprises a modification of first rectangle 40 as seen in FIG. 3 to be a first rectangle 140, but second rectangle 42 is substantially the same in FIG. 4 as is seen in FIG. 3. A device 44 is seen as comprising a device body 46 and a lead connector 48. It can also be seen that peninsular electrical lead configuration 16 comprises four leads that are electronically connected to the four leads depicted at lead connector 48

A cable 50 is insertable at lead connector 48 to make electronic communication with device 44. Cable 50 has a cable body 68 that may also be made of translucent material such that light emanating from light source 38 may be piped through device body 46, into cable body 68 and emanating out of cable body 68 visible to the user. As such, device diagnostics may be visible to the user such as illumination, multi-colored illumination, intermittent illumination such blinking, and multi-colored intermittent illumination such as blinking of more than one light color.

Figure 5A:
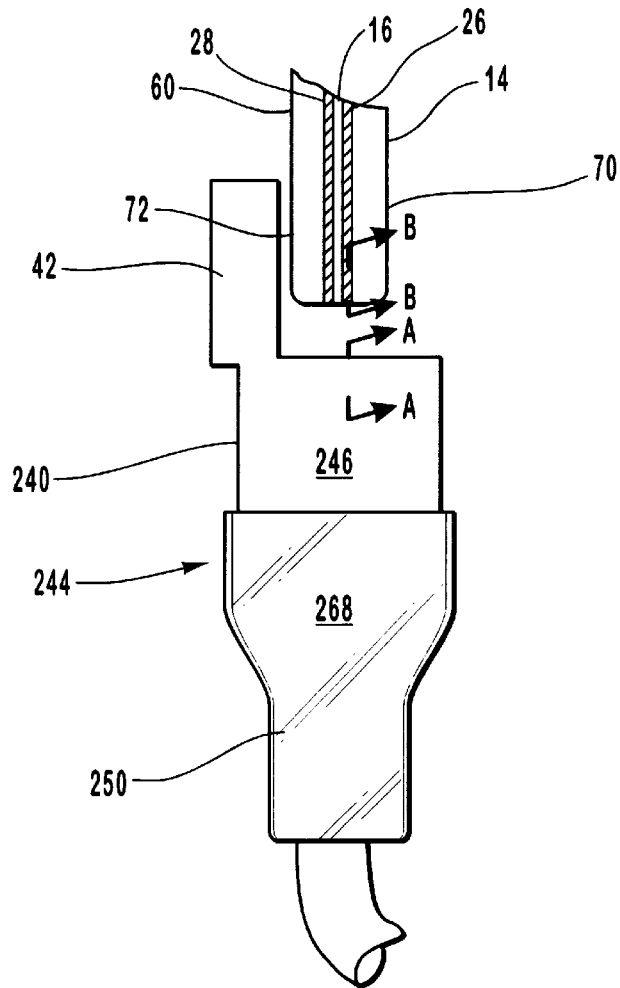
FIGS. 5a and 5b are illustrations of an alternative embodiment wherein an electronic device is integrally formed with a cable body and a cable and that is insertable upon the finger of the PCB depicted in FIG. 1.
Figure 5B:
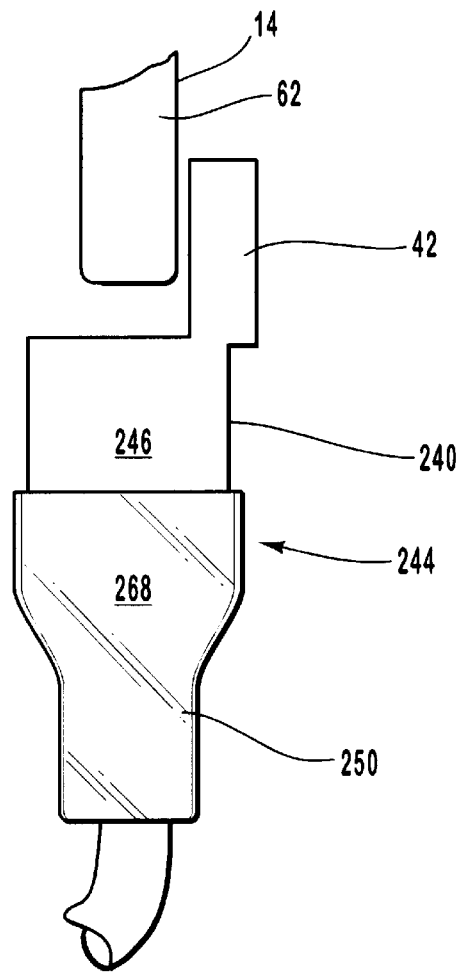

In another embodiment of the present invention, the electronic communication means may be an insertable electronic device that may be integrally connected to the cable. As such, as seen in FIG. 5a, a cable 250 is seen in top plan view comprising a cable body 268 and a device body 246. Device body 246 is made of two parts including a first rectangle 240 and second rectangle 42 as has been discussed previously. FIG. 5b illustrates cable 250 as viewed from a bottom-up plan view. Between FIGS. 5a and 5b, it can be seen that peninsular electrical lead configuration 16 upon finger 14 comprises two electrical leads, although more leads could be found upon the upper surface 60 of finger 14 of PCB 12 and upon the lower surface 62 of finger 14 of PCB 12. As can be seen, the device body 246 is integral with cable 250. As such, device 244 may be as simple as an interconnect between a PCMCIA card and an external device or it may itself have complex electronic circuitry within device body 246 as a stand-alone electronic device that also makes electronic communication through cable 250. Although device body 246 includes the presence of second rectangle 42, an alternative embodiment of device body 246 includes the absence of second rectangle 42. Another general alternative embodiment includes a single rectangular structure that has a device footprint that is formed by drawing a single rectangle to encompass all of first rectangle 40 and second rectangle 42.

Figure 6:
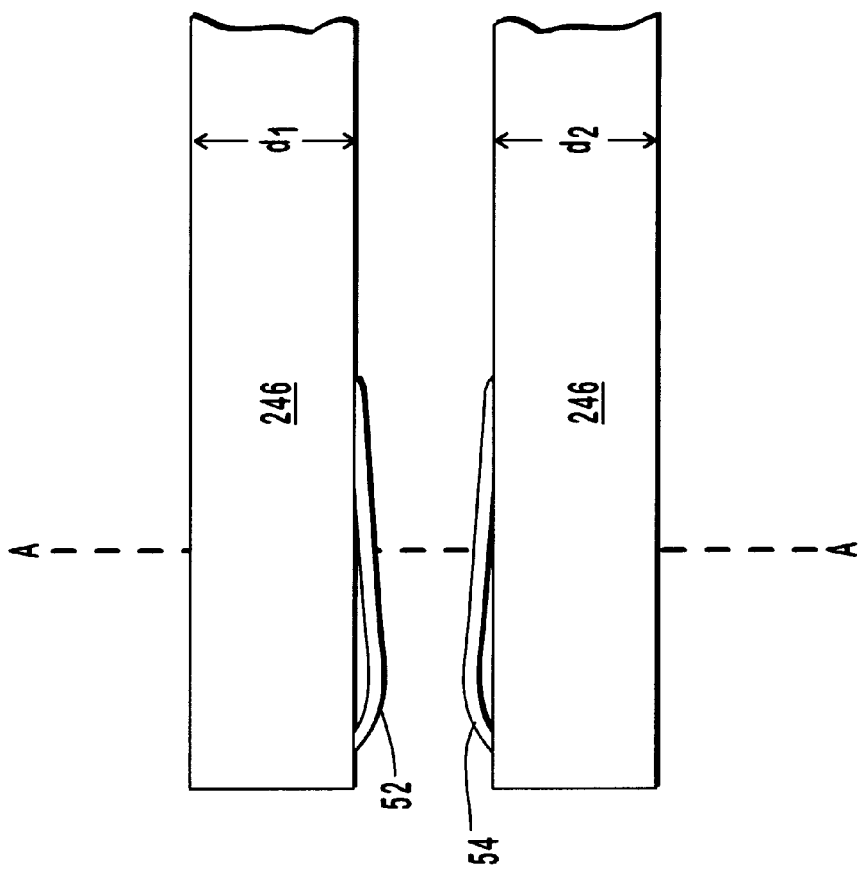
FIG. 6 is an elevational cross-section view of alternative embodiments illustrated in FIGS. 4 and 5 wherein it can be seen that both the upper surface and the lower surface of the PCB may include electrical traces and corresponding electrical runners on the device body are configured to make electrical contact therewith.
Figure 6:
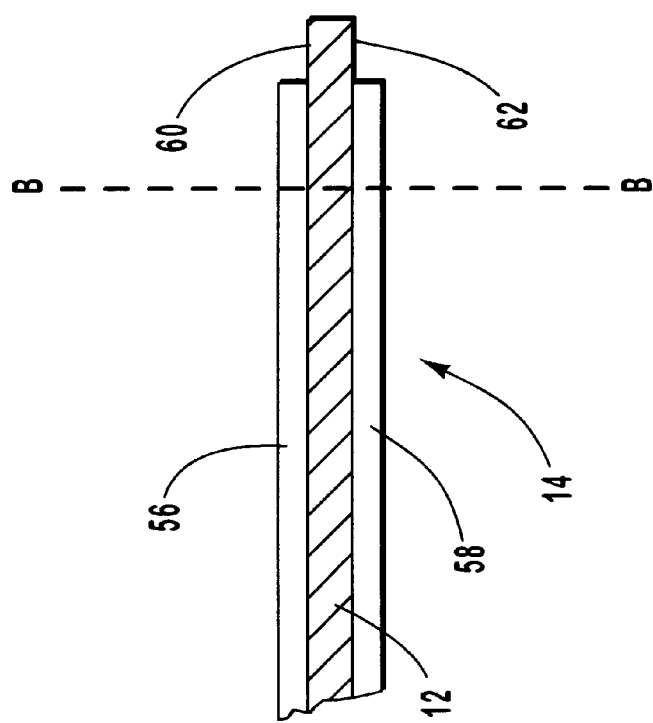

FIG. 6 is a cross-section elevation view of alternative structures depicted in FIGS. 4 and 5 as taken along the dashed lines A—A and B—B. It can be seen that PCB 12 has at least two electronic leads configured upon upper surface 60 of PCB 12 and lower surface 62 of PCB 12 as an upper trace 56 and a lower trace 58, respectively. Where upper trace 56 and lower trace 58 are seen only in cross-section as two single traces, it is to be understood that both upper surface 60 and lower surface 62 may have anywhere between one and eight occurrences or more of upper trace 56 and lower trace 58, respectively. As an example thereto, upper surface 60 may contain a single occurrence of upper trace 56 and lower surface 62 may include a single occurrence of lower trace 58. Upper trace 56 and lower trace 58 may act as the tip and ring leads for a PCMCIA card. Further, upper trace 56 and lower trace 58 may be substantially not coplanar such that, for example upper trace 56 may be found near a first edge 70 (FIG. 5a) of finger 14 and lower trace 58 may be found near a second edge 72 of finger 14. As such, the distance between upper trace 56 and lower trace 58 is maximized.

Another embodiment of the present invention provides for tip and ring leads to be found upon either upper surface 60 or lower surface 62, and as many as eight leads or more to be found upon the opposite surface. Another embodiment provides for as many as eight leads or more upon upper surface 60 and as many as eight leads or more upon lower surface 62. Another embodiment provides for as many as eight leads or more upon either upper surface 60 or lower surface 62 and seven, or six, or five, or four, or three, or two, or even one lead to be found upon the lower surface. This configuration is preferred where a single or at least two leads carry a substantially higher voltage than the other leads Another embodiment of the present invention provides for separating at least one higher voltage lead per surface of PCB 12 upon finger 14 from other leads. As such, as many as seven leads each or more may be found upon both upper surface 60 and lower surface 62 where a gap is provided between the higher voltage lead and the other leads.

In FIG. 6, it can also be seen that device body 246 (which may also be cable body 68) has an upper runner 52 and a lower runner 54. Upper runner 52 and lower runner 54 are configured to slidably contact upper trace 56 and lower trace 58. The aforementioned trace combinations and configurations are also applicable to corresponding combinations and configurations of occurrences for upper runner 52 and lower runner 54. Additionally, a standardized device body with as many as eight occurrences or more of upper runner 52 and as many as eight occurrences or more of lower runner 54 may be provided wherein selected runners are simply dummy runners in that no electronic connection is completed.

It can also be seen that device body 246 has two dimensions $d_1$ and $d_2$. Although $d_1$ and $d_2$ appear to be substantially equivalent in length, a preferred embodiment provides for $d_1$ to be substantially greater than $d_2$ such that the bulk of the electronic circuitry contained in device body 246 is within the bounds of $d_1$. Where $d_1$ and $d_2$ are substantially equal, a preferred embodiment is where device body 246 is substantially a simple electronic interconnect between electronic devices. Another preferred embodiment provides for $d_2$ to be substantially greater than $d_1$ such that the bulk of the electronic circuitry contained in device body 246 is within the bounds of $d_2$. In any embodiment, finger 14 of PCB 12 is preferably suspended mid-air so that lower runner 54 slidably contacts lower trace 58 without jamming against terminus 66 of finger 14.

Figure 7:
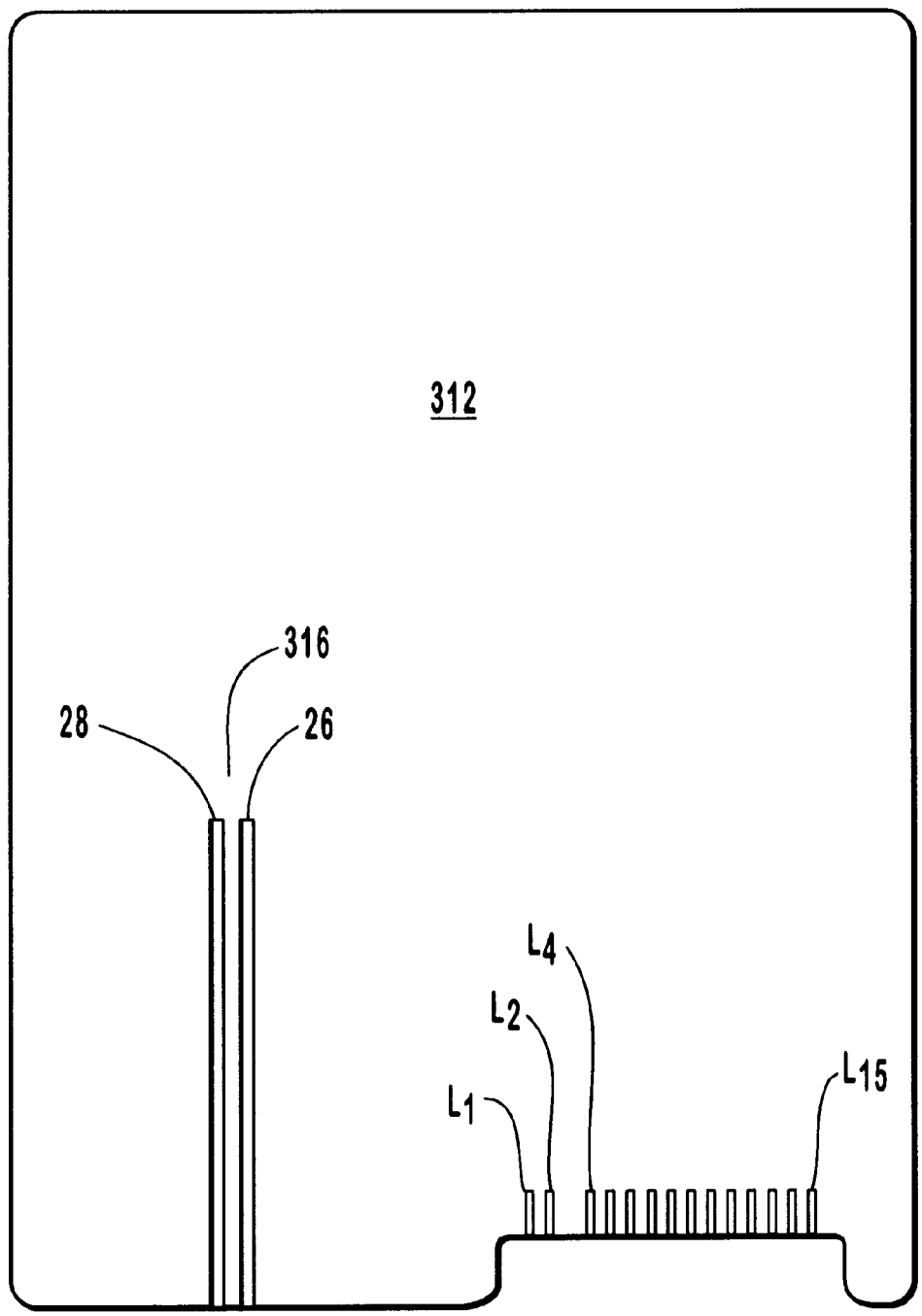
FIG. 7 is a plan view of a circuit support structure that has a section configured to receive a sliding device.

FIG. 7 is an illustration of an alternative embodiment of the present invention, wherein it can be seen that a solid state electronic circuitry support means such as a printed circuit board 312 has an electrical contact means disposed upon the printed circuit board 312. In this embodiment, printed circuit board 312 is substantially rectangular; in other words, there is no finger 14 of PCB 12 as seen in FIGS 1–5b. The electrical contact means disposed upon printed circuit board 312 has a peninsular electrical lead configuration 316 that acts as traces for making electrical contact with an electronic communication means by slidably disposing the electronic communication means onto peninsular electrical lead configuration 316. "A 15-pin connector with pins $L_1, L_2, \ldots L_{15}$ may also be attached to the printed circuit board 312." The gripping means for guiding the slidably disposed electronic communication means may be a device such as rail 20 as seen as part of frame 18 in FIG. 2. Alternatively, the device may have a first rectangle and a second rectangle, or it may be a simple rectangular structure with the ability to mount it upon a rail as set forth above.

Examples of preferred electronic communication means includes electronic devices such as interconnects such as an RJ-11 jack and an RJ-45 jack. These jacks may be "pop-out" such that light emanating from light source 38 is piped through the device body and made visible to the user.

Another example of a preferred electronic communication means includes an electronic device such as an IRDA transceiver. The IRDA transceiver has runners that make electrical contact with peninsular electrical lead configuration 16 and is also slidably disposed thereupon. In this embodiment, the presence of second rectangle 42 as a portion of device footprint 32 is optional. The IRDA transceiver may preferably have the presence of second rectangle 42 to provide for "pop-out" capability that also has the advantage of locking mechanisms that interconnect with rail 20. Additionally, light emanating from light source 38 may be piped through the IRDA transceiver so as to be visible to the user to provide a visible diagnostic as set forth above.

Another example of a preferred electronic communication means is an electronic device such as an electronic video interface. Such an electronic device may include cable 250 that has device body 246 with electronic video circuitry found therein and with leads that continue through cable body 268 to a device such as a camcorder, a video cassette player, or a video cassette receiver. In this embodiment as in other embodiments, light may be generated at light source 38 and piped through translucent portions of device body 246 into cable body 268 such that a user-visible device diagnostic is provided as set forth above, Another example of a preferred electronic communication means is a compact flash memory card such as that used in digital cameras.

The present invention may be embodied in other specific forms without departing from its spirit or essential characteristics. The described embodiments are to be considered in all respects only as illustrated and not restrictive. The scope of the invention is, therefore. indicated by the appended claims rather than by the foregoing description. All changes which come within the meaning and range of equivalency of the claims are to be embraced within their scope.

What is claimed and desired to be secured by United States Letters Patent is:

1. A PCMCIA card comprising:
   a printed circuit board having a peninsular electrical lead configuration upon a printed circuit board finger;
   electronic communication means, wherein said electronic communication means makes electrical contact with said peninsular electrical lead configuration;
   wherein said peninsular electrical lead configuration has a plurality of leads upon an upper surface of said printed circuit board and a plurality of leads upon a lower surface of said printed circuit board, wherein said upper surface and said lower surface are substantially parallel planar;
   wherein said upper surface contains a gap greater than the width of any of said leads between at least two of said leads, and wherein said lower surface contains a gap greater than the width of any of said leads between at least two of said leads.

2. A communication system comprising:
   solid state electronic circuitry support means;
   electrical contact means disposed upon said solid state electronic circuitry support means;
   electronic communication means slidably disposed upon said electrical contact means wherein said electronic communication means has at least a portion thereof that is translucent;
   means for guiding said slidably disposed electronic communication means;
   first locking means for holding said slidably disposed electronic communication means in a recessed position;
   second locking means for holding said slidably disposed electronic communication means in an extended position; and
   a light source, wherein said light source illuminates at least a portion of said electronic communication means.

3. An electrical apparatus comprising:
   a printed circuit board including a main body portion with an upper surface, a lower surface and a first outer edge;
   an elongated finger including a first end connected to said printed circuit board at an origin, said elongated finger including a second end with an outer edge distal said origin, said outer edge of said elongated finger being generally aligned with at least a portion of said first outer edge of said printed circuit board; and
   a sliding structure being slidably disposed on said elongated finger, said sliding structure being sized and configured to be positioned in a first position with an outer edge of said sliding structure being generally aligned with at least a portion of said first outer edge of said printed circuit board.

4. The apparatus according to claim 3, further comprising one or more electrical leads connected to said elongated finger and one or more electrical runners connected to said sliding structure; wherein at least one of said one or more electrical leads and at least one of said one or more electrical runners electrically connect said sliding structure and said elongated finger when said sliding structure is slidably disposed on said elongated finger.

5. The apparatus according to claim 4, wherein at least one of said one or more electrical leads extends substantially the entire length of said elongated finger.

6. The apparatus according to claim 4, further comprising a locking mechanism to secure said sliding structure in contact with said one ore more electrical leads.

7. The apparatus according to claim 3, further comprising a port connected to said sliding structure, said port being sized and configured to allow communication to be established between an electronic device and said printed circuit board.

8. The apparatus according to claim 3, further comprising a cable connected to said sliding structure, said cable being sized and configured to allow communication to be established between an electronic device and said printed circuit board.

9. The apparatus according to claim 3, wherein said sliding structure is sized and configured to be removed from said elongated finger and replaced with another sliding structure.

10. The apparatus according to claim 3, further comprising a second position wherein said sliding structure i s slidably disposed on said elongated finger and wherein a portion of said sliding structure extends beyond said outer edge of said printed circuit board.

11. The apparatus according to claim 3, wherein said sliding structure includes a body with a generally rectangular first portion that is connected to a generally rectangular second portion.

12. The apparatus according to claim 3, further comprising a translucent housing of said sliding structure and a light source positioned proximate to said translucent housing, said light source providing light to said translucent housing of said sliding structure.

13. The apparatus according to claim 3, further comprising a frame connected to said printed circuit board, said frame including a rail generally positioned generally parallel to said elongated finger, said rail being sized and configured to contact said sliding structure.

14. The apparatus according to claim 3, further comprising an opening in said sliding structure, said opening being sized and configured to receive said elongated finger.

15. The apparatus according to claim 14, further comprising a first outer surface of said sliding structure and a second outer surface of said sliding structure, wherein a first distance generally measured from said opening to said first outer surface is larger than a second distance generally measured from said opening to said second outer surface.

16. An electronic communications card comprising:
   a printed circuit board including a main body portion with an upper surface, a lower surface and a first outer edge;
   an elongated finger connected to said printed circuit board at an origin, said finger including an upper surface, a lower surface and a length, said elongated finger extending generally along an axis;
   one or more electrical leads disposed on said elongated finger, said electrical leads extending generally parallel to said axis of said elongated finger, said electrical leads extending substantially the entire length of the finger;
   a connector slidably disposed on said elongated finger; and
   one or more electrical runners connected to said connector, at least one of said one or more runners being sized and configured to be electrically connected to at least one of said one or more electrical leads to allow electrical communication to be established between said connector a nd the electronic communications card.

17. The electronic communications card according to claim 16, wherein said connector is readily replaceable to allow various devices to be electrically connected to the communications card.

18. The electronic communications card according to claim 16, further comprising a first position wherein said connector is positioned with an outer edge of said connector being generally aligned with at least a portion of said first outer edge of said printed circuit board.

19. An apparatus comprising:
- a printed circuit board including a main body portion with an upper surface, a lower surface, a first outer edge and a second outer edge;
- one or more elongated electrical traces being positioned proximate said first outer edge of said printed circuit board, said one or more elongated electrical traces being exposed on said upper surface of said printed circuit board;
- a sliding structure being slidably disposed on said one or more elongated electrical traces; and
- one or more electrical runners connected to said sliding structure, at least one of said one or more electrical runners being electrically connected to at least one of said one or more electrical traces to allow electrical communication between said sliding structure and said printed circuit board.

20. The apparatus according to claim 19, further comprising a first position in which an outer edge of said sliding structure is generally aligned with at least a portion of said second outer edge of said printed circuit board.

21. The apparatus according to claim 19, further comprising a second position in which said sliding structure is electrically connected to said printed circuit board and a portion of said sliding structure extends beyond said second outer edge of said printed circuit board.

22. The apparatus according to claim 19, further comprising a translucent housing of said sliding structure and a light source positioned proximate to said translucent housing, said light source providing light to said translucent housing of said sliding structure.

23. The apparatus according to claim 19, further comprising a frame with a rail and a rail slot, said sliding structure being mounted on said rail and in said rail slot.

24. The apparatus according to claim 19, wherein said sliding structure is removable and replaceable with another sliding structure to allow electrical communication to be established between an electronic device and the printed circuit board.

25. The apparatus according to claim 19, further comprising a frame and a locking mechanism that releasably locks said sliding member to the frame.

26. The apparatus according to claim 19, wherein the sliding structure is slidably disposed upon substantially the entire length of said one or more elongated electrical traces.

27. The apparatus according to claim 19, further comprising a communication port connected to said sliding member, said communication port being sized and configured to receive a communication plug.

28. An electronic communications card comprising:
- a printed circuit board including a main body portion with a first edge and a second edge;
- an elongated finger having a length extending along an axis, a first end of said finger connected to said printed circuit board and a second end of said finger being generally aligned with at least a portion of said first edge of said printed circuit board;
- one or more electrical traces extending substantially the entire length of said finger; and
- a frame enclosing at least a portion of said printed circuit board, said frame including a rail that is generally aligned with said axis of said finger, said rail being sized and configured to guide a connector along said finger, the connector being sized and configured to allow electrical communication to be established between an electronic device and the electronic communications card.

29. The electronic communications card according to claim 28, further comprising a rail slot that is generally aligned with said axis of said finger.

\* \* \* \* \*

UNITED STATES PATENT AND TRADEMARK OFFICE
CERTIFICATE OF CORRECTION

PATENT NO. : 6,109,934
DATED : August 29, 2000
INVENTOR(S) : Brent D. Madsen, David D. Oliphant It is certified that error appears in the above-identified patent and that said Letters Patent is hereby corrected as shown below:

Title page,
U.S PATENT DOCUMENTS,
Line 11, U.S. Pat. No. 5,679,013, please change "Matsunaga et al." to -- Matsumaga --

Column 1,
Lines 25-26, please change "3Com. corporation of santa clara, california" to -- 3COM Corporation of Santa Clara, California, --

Column 2,
Line 28, please change "device is "a device" to -- device is a device --
Line 33, please change "receive the data." The" to -- receive the data. The --

Column 3,
Line 54, please change "plan view illustration" to -- plan-view illustration --

Column 4,
Line 22, please change ""FIG. 1 illustrates" to -- FIG. 1 illustrates --
Line 26, please change "used.". It can" to -- used. It can --
Line 49, please change "PCB 12. "For example, the" to -- PCB 12. For example, the --
Line 58, please change "connector 34." Additionally," to -- connector 34. Additionally, --

Column 5,
Line 21, please change ""A spring (not" to -- A spring (not --
Line 23, please change "functionality. "" to -- functionality. --
Line 39, please change "is illustrated as covering" to -- covering --

UNITED STATES PATENT AND TRADEMARK OFFICE
CERTIFICATE OF CORRECTION

PATENT NO.   : 6,109,934
DATED        : August 29, 2000
INVENTOR(S)  : Brent D. Madsen, David D. Oliphant It is certified that error appears in the above-identified patent and that said Letters Patent is hereby corrected as shown below:

Column 6,
Line 27, please change "5,183,404; the" to -- 5,183,404, and the --
Line 42, please change "connector 48" to -- connector 48. --
Line 44, please change "the other leads" to -- the other leads. --

Column 10,
Line 21, please change "sliding structure i s" to -- sliding structure i s --
Line 66, please change "connector a nd the electronic" to -- connector and the electronic --

Signed and Sealed this

Eighteenth Day of December, 2001

Attest:

JAMES E. ROGAN
*Attesting Officer*   *Director of the United States Patent and Trademark Office*